United States Patent [19]
Tsunemitsu

[11] 3,988,214
[45] Oct. 26, 1976

[54] METHOD OF FABRICATING A SEMICONDUCTOR DEVICE

[75] Inventor: Hideo Tsunemitsu, Tokyo, Japan

[73] Assignee: Nippon Electric Company, Ltd., Tokyo, Japan

[22] Filed: June 13, 1969

[21] Appl. No.: 833,095

[30] Foreign Application Priority Data
June 17, 1968  Japan.............................. 43-41769
Dec. 28, 1968  Japan.............................. 44-925

[52] U.S. Cl................................... 204/15; 29/577; 357/54; 357/72
[51] Int. Cl.²..................... C25D 5/02; B01J 17/00; H01L 23/30
[58] Field of Search .............. 204/15; 317/234, 101; 174/68.5; 117/212; 29/577; 357/73, 54

[56] References Cited
UNITED STATES PATENTS

| | | |
|---|---|---|
| 3,169,892 | 2/1965 | Lemelson............................ 317/234 |
| 3,337,426 | 8/1967 | Celto .................................... 204/15 |
| 3,461,347 | 8/1969 | Lemelson............................ 317/101 |
| 3,468,728 | 5/1969 | Martin ................................ 29/577 |
| 3,634,203 | 1/1972 | Richardson et al. ................. 204/15 |

Primary Examiner—T. M. Tufariello
Attorney, Agent, or Firm—Hopgood, Calimafde, Kalil, Blaustein & Lieberman

[57] ABSTRACT

An integrated circuit device with multi-level interconnection wiring structure built upon the substrate wherein each level is formed of conductor and insulator portions and wherein each level has a surface substantially parallel to the surface of the substrate.

The method of fabricating the above-described device wherein a suitable substance such as aluminum is deposited over the surface of the substrate to form a metal film, and wherein the aluminum or other substance is then selectively anodized into insulating portions around conducting channels.

16 Claims, 6 Drawing Figures

METHOD OF FABRICATING A SEMICONDUCTOR DEVICE

This invention relates to a semiconductor device having a substantially flat surface and, more specifically, to a semiconductor integrated circuit device having multi-level interconnection structure.

BACKGROUND OF THE INVENTION

Semiconductor devices have been developed to afford a higher degree of reliability and integration. It is desirable that these highly integrated circuit devices have multi-level interconnection structure on the surface of the semiconductor substrate to provide lead-out wirings to each of the semiconductor regions in the substrate.

The lead-out wirings for conventional semiconductor devices are formed by selective photo-etching of a thin metal film formed by sputtering or vacuum evaporation of metal over the semiconductor substrate. However on the surface of the substrate, a certain degree of unevenness is unavoidable in lead-out wiring formed in that manner. Furthermore, since an overlying wiring layer is juxtaposed with an uneven underlying wiring layer, the problem of unevenness is worsened as layers laminated and multi-level interconnections are formed.

Additionally it is known in the art that when the metal film forming the wiring is deposited on the substrate surface, the thickness of the metal film is often insufficient at the end portions of the wiring. Moreover, the end portions of the wiring are particularly vulnerable to selective etching. As a result, the wirings may become defective and hence the reliability is decreased. Thus, with the conventional technique of selective etching, it is almost impossible to provide a highly reliable integrated circuit device, especially one having multi-level interconnection structure.

OBJECTS OF THE INVENTION

It is, therefore, the principal object of this invention to provide a semiconductor device having highly reliable interconnection structure.

Another object of the invention is to provide a semiconductor device in which the conductive layers for wiring are formed without resorting to a selective photo-etching process.

Still another object of this invention is to provide a semiconductor integrated circuit device having multi-level interconnection structure of the high reliability in which each of wiring layers and insulator layers is made substantially flat to avoid the above-mentioned irregularities and unevenness.

A further object of this invention is to provide an improved and simplified method of manufacturing a high reliable semiconductor integrated circuit device.

SUMMARY OF THE INVENTION

According to this invention, there is provided a semiconductor device which comprises a semiconductor substrate having a necessary number of circuit components therein and at least one layer of wiring structure. The wiring structure or wiring layer comprises electrodes or lead-out wirings together with insulator material chemically changeable to the material of the electrodes. More specifically, the wiring layer is formed by uniformly depositing a sheet material of one electrical property (conductive) on the substrate surface and selectively changing the material to give another property (insulative).

Also, according to the present invention, a semiconductor device is produced which comprises a first conductive layer formed on the semiconductor substrate, and an insulator layer which covers the first layer and has a surface substantially parallel to that of the substrate and substantially flat, and a second layer of conductor wirings formed on the surface of the first insulator layer. This structure may have additional conductor wiring layers and insulator layers.

Furthermore, in accordance with the invention, a semiconductor device is provided in which the surface of each of the wiring layers is made substantially flat by coating the semiconductor substrate with a film of conductive or insulating material of uniform thickness, subjecting to anode oxidation those portions of the conductive material which do not correspond to the wirings to be formed, while subjecting to reduction those portions of insulating material which correspond to the wirings.

The semiconductor devices of this invention are thus free from selective etching in the formation of metallic wirings, making it possible to provide flatter and smoother wirings on the semiconductor substrate.

Experiments have indicated that substances suited for deposition on the semiconductor substrate include anodizable metals such as aluminum, tantalum, titanium, niobium, and hafnium.

To facilitate understanding of the features and the objects of the present invention, the detailed description of the invention will be made in conjunction with the accompanying drawings, in which:

BRIEF DESCRIPTION OF THE DRAWINGS

FIGS. 5(A) through 5(E') show cross-sectional views illustrating another method of manufacturing the semiconductor device of this invention.

DESCRIPTION

Referring to FIGS. 1(A) through 1(D), a conventional prior art semiconductor device with multi-level interconnection structure is shown with metal channels 102 formed on a planar type semiconductor substrate 101 through a selective etching process (FIG. 1(A)). An insulator film 103 is applied uniformly over the substrate and the metal channels 102 (FIG. 1(B)). Although the plane of the semiconductor substrate shown is flat, it is clear from FIG. 1B that the surface of the substrate (i.e. the surface of the oxide and other insulative film formed on the semiconductor) is uneven due to the selective photo-etching process employed to form the metallic channels 102. As a result, the subsequent process steps to be described hereunder become difficult to perform causing a reduction in the reliability of the metallic channels.

Figure 1:
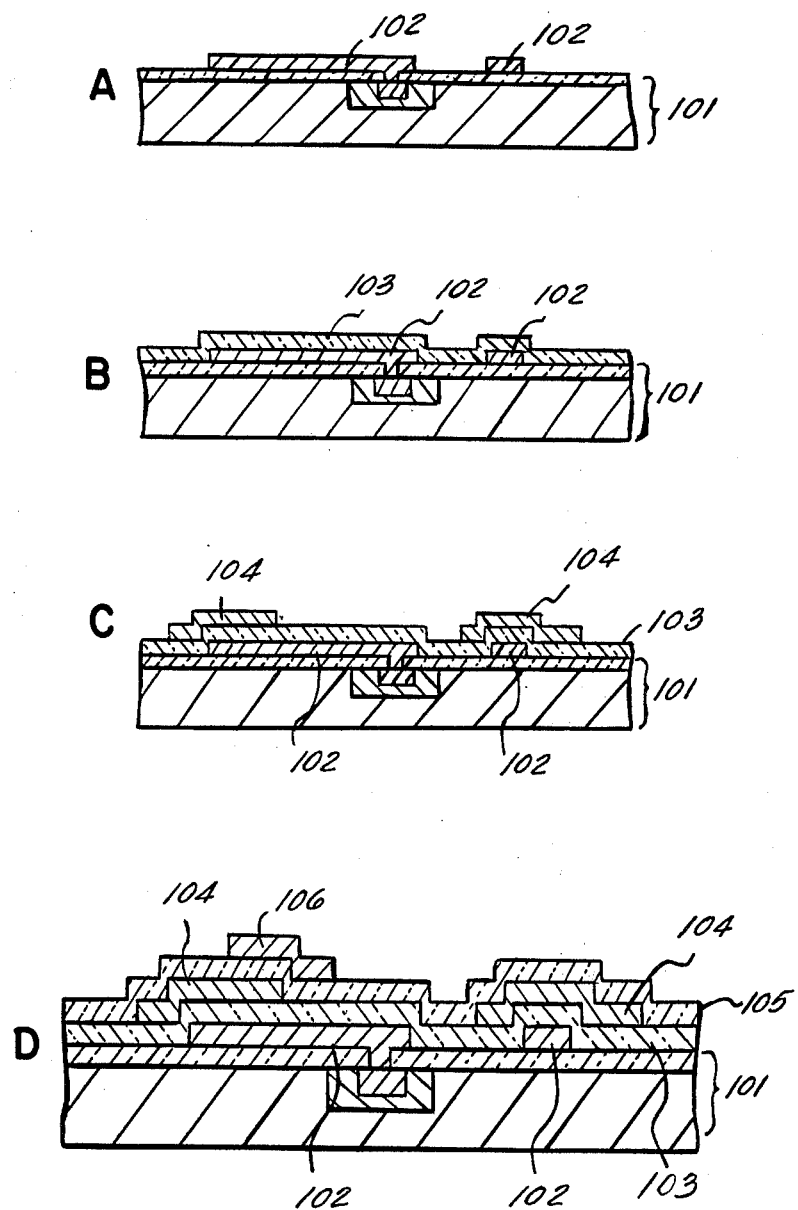
FIGS. 1(A) through 1(D) show cross-sectional views of the conventional prior art semiconductor device illustrated in the order of the steps of the manufacturing process.

Referring further to FIG. 1, it will be noted that the prior art conductor device with a multi-level interconnection structure is produced by first covering the surface of the above-mentioned metallic channels 102 with the insulator film 103. The second layer of metal is then deposited on the insulator film 103 and selectively etched away to provide the second-level metallic channels 104 (FIG. 1(C)). In the same manner, another insulator film 105 and a metal film is deposited. Through the selective photo-etching of the last-mentioned metal film a third-level metallic channel 106 is formed on the insulator film 105 as shown in FIG. 1(D). In this structure, it may be observed that any unevenness of the metal and insulator layers is accumulated toward the surface of the higher level layers.

It has been the practice to form the metal film on the surface of the substrate by resorting to vacuum evaporation of sputtering metal particles. These processes produce vertical portions the deposited metallic layer which are thinner and less adherent than the horizontal portions parallel to substrate surface. Furthermore, the photo resist substance for selective etching, when applied on this metallic layer by rollers is subjected to a centrifugal force causing the substance to thin out on the outward sides of the "hills" of the metallic layer in relation to the coating on the rest of the underlying layer. Accordingly, when metallic channels are provided on a substrate having an appreciably uneven surface, they are more easily etched into the vertical portions broken than the portions parallel to the surface of the basic semiconductor substrate. As a result, semiconductor devices manufactured by the foregoing process are difficult to fabricate uniformly thus making it practically impossible to produce reliable multi-level wiring layers of the type described above.

Figure 2:
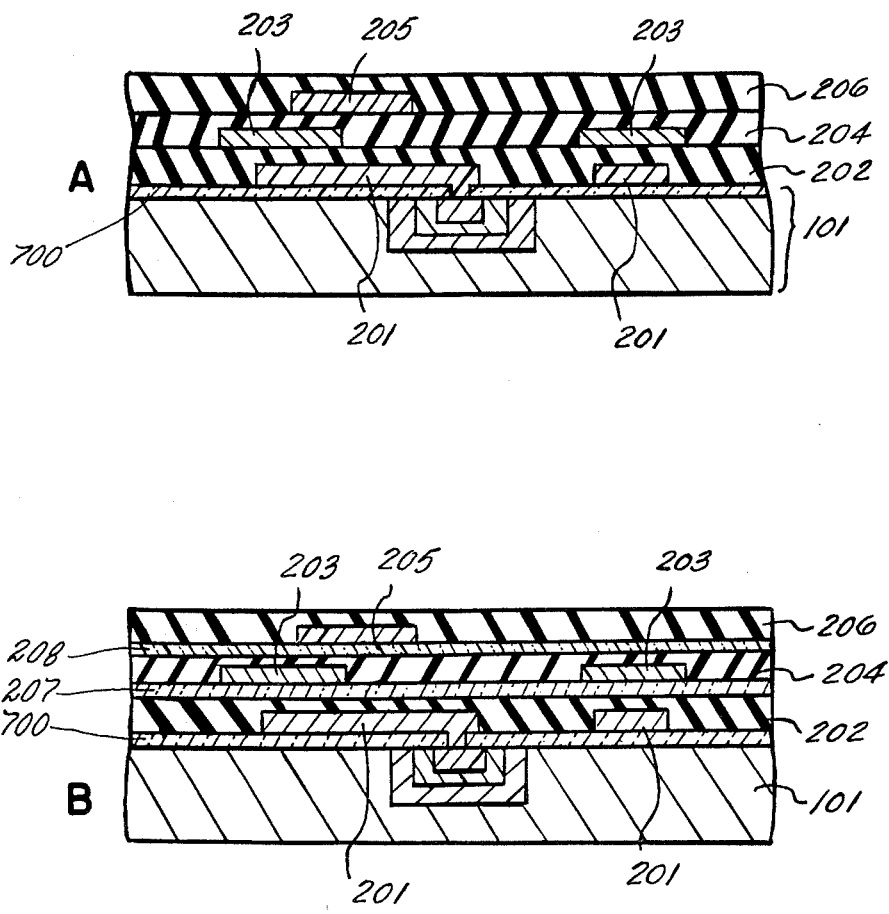
FIGS. 2(A) and 2(B) respectively show cross-sectional views of a first embodiment of this invention and a modification.
Figure 4:
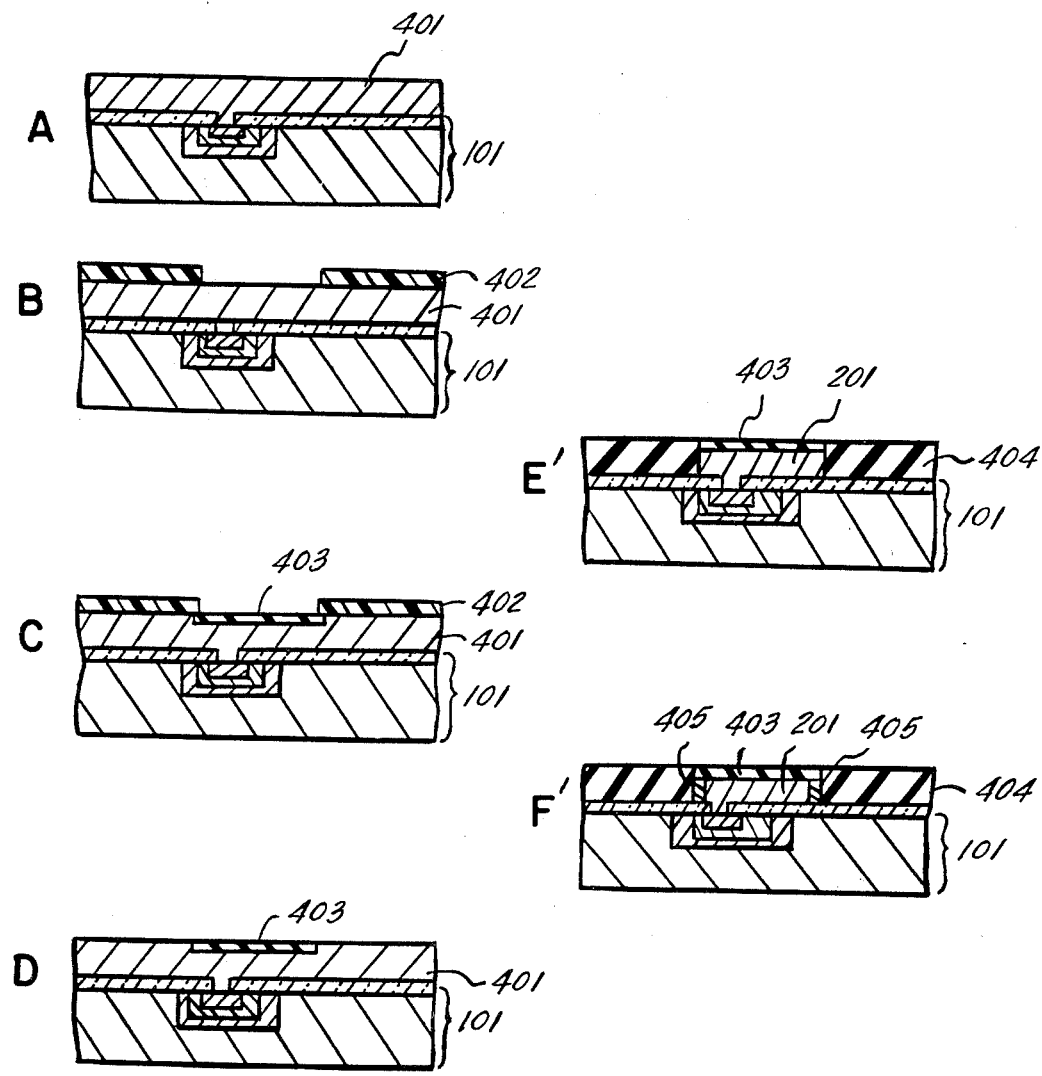
FIGS. 4(A) through 4(F) show cross-sectional views illustrating the method of manufacturing the semiconductor device of this invention.

Referring to FIG. 2 which shows a preferred embodiment of the present invention, the semiconductor device comprises a semiconductor substrate 101 which comprises of a base substrate of silicon having the necessary number of circuit elements and an insulator film of silicon 700 formed over the base substrate. This structure of the substrate 101 may be quite similar to the conventional semiconductor device illustrated in FIG. 1. On the surface of the substrate 101, first layer channels 201 are formed from aluminum and covered with a first insulator film 202 of alumina. The channels 201 are formed by selectively anodic oxidizing an aluminum sheet to form the alumina film 202. The film 202 formed in this way has a substantially flat surface parallel to the surface of the substrate 101. The channels 201 serve as electrodes for circuit elements or mutually interconnect the electrode region of the circuit elements. Conducting channels 203 and 205 together with insulating films 204 and 206 are formed in like manner on the substantially flat surface of film 202. A step-by-step explanation of the process of forming the above-mentioned films and layers will be given later in reference to FIG. 4.

As will be apparent from the foregoing, each of the wiring layers is formed on each of the underlying wiring layers covered with alumina film. Each of the underlying layers is flat so that the overlying layer is easily formed thereon. Moreover, since the underlying wiring layers are formed by the selective anodization of the aluminum film and not by a photo-etching process, this structure is capable of maintaining the flatness of the underlying surface. It follows, therefore, that all the defects attributable to the problem of unevenness involved in the prior art structures, can be obviated.

This embodiment can also be realized by using other metals in place of aluminum, such as titanium, tantalum, and others suited for anode oxidation.

FIG. 2(B) shows a semiconductor device in which silicon dioxide films 207 and 208 are interposed between two of the wiring layers. The silicon dioxide films 207 and 208 are formed by a vapor growth or sputtering process, with a view to reducing the capacitance between the aluminum channels 201 and 203 in each wiring layer.

In this embodiment, the silicon dioxide films may be replaced by other insulating materials such as ceramics, glass and metal oxides deposited by the vapor evaporation or sputtering processes.

Figure 3:
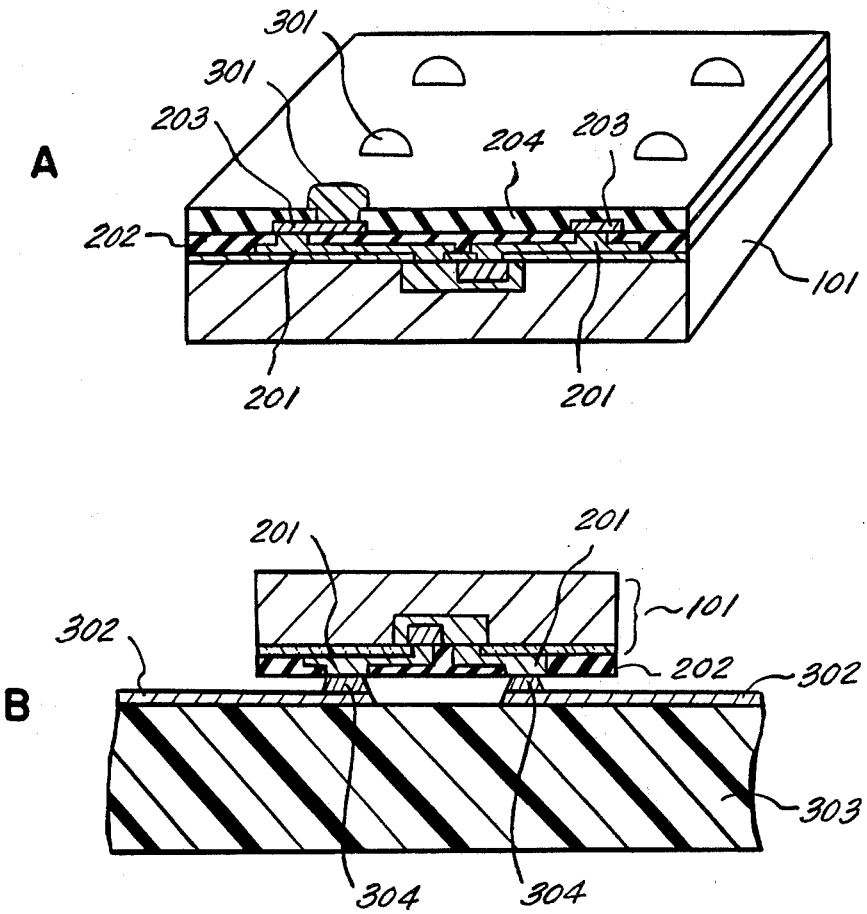
FIGS. 3(A) and 3(B) respectively show a perspective and a cross-sectional view of another embodiment of the invention.

Referring to FIG. 3(A) which illustrates another embodiment of the invention, the semiconductor device has on the substrate 101, first and second wiring layers formed in the above-described manner. The wiring layers comprise a first layer of aluminum channels 201, an aluminia film 202, a second layer of aluminum channels 203, and another film 204. On the upper wiring layer of this embodiment, there is provided a plurality of protruding electrodes 301 which connect the desired portions of upper channels 203 through openings formed in the aluminia film 204. The protruding electrodes 301 are formed through a technique well known in the flip-chip semiconductor art, in which solder balls, electroplated bumps or beam leads are employed as the electrode to the outer circuit.

FIG. 3(B) shows a semiconductor device having a flip-chip type semiconductor die similar to that of FIG. 3(A) attached to the leads 302 adherent to the surface of the ceramic substrate 303. At the bonding portion, the inside edges of the leads 302 have protrusions 304. These protrusions 304 are firmly attached to the exposed surfaces of the channels 201 of the semiconductor die. The semiconductor die of the embodiment has the structure illustrated in FIG. 3(B). More particularly, the die has a substantially flat surface coated with insulated film formed through the anode oxidation process. This semiconductor device using face-bonded structure is characterized by ease of manufacture with a high degree of reliability maintained.

Referring to FIGS. 4(A) to (F) which show a preferred method of manufacturing the semiconductor device of the present invention in the order of the steps. The processing method involves a series of selective anodization steps, as described hereunder. In the first step, semiconductor substrate 101 with circuit elements yet to be processed for internal and external connections is uniformly covered with a 1-micron-thick aluminum film 401 deposited by the vacuum evaporation process (FIG. 4(A)). The surface of aluminum film 401 is covered with a photo resist layer 402 (FIG. 4(B)) at those portions other than the portion at which the wiring layer is to be formed. Using the photo resist 402 as a mask, the semiconductor substrate 101 with aluminum film deposited on it, is connected to a positive electrode, the anode forming solution is maintained at a negative potential, and anodic oxidation is carried out. Alternatively, the semiconductor substrate and the aluminum film 401 may be connected to the positive electrode to carry out anodic oxidation. Thus, the exposed surface of aluminum film 401 is selectively covered by a non-porous alumina 403 (FIG. 4(C)). It should be noted that the non-porous alumina layer is formed by the constant-voltage anodization with ammonium-borate saturated ethylene glycol solution employed as the anodizing agent. In tis process, the voltage applied is 40 to 45 volts and the processing time is about 3 minutes. If the voltage is too high or if the processing time is too long, the photo resist loses its adherence to the aluminum surface especially at the peripheries of the photo-resist film.

After the non-porous anode-oxidized 403 formed, the photo resist 402 is removed from the aluminum surface by a suitably removing agent (FIG. 4(D)). The selectively formed non-porous alumina layer serves as a mask against further anodization when thhe unmasked aluminum 404 film 401 is changed to porous alumina (FIG. 4(E)). Upon completion of this step, the insulator film formed of non-porous alumina layer 403 and porous alumina 404 and an aluminum channel 201 covered with alumina form the wiring layer. The solution for converting aluminum into porous alumina may be a 2–5% acid applied to the aluminum at the temperature of 20° C and the formation is performed at a constant voltage 20 volts.

Finally, repeating the above-mentioned anodization process non-porous alumina 405 is formed on both sides of the aluminum channel 201, for stabilizing the chemical and electrical properties of the wiring layer (FIG. 4(F)). The anodic oxidation in this final stage of processing begins with constant-current generation using the semiconductor substrate as the anode. When the voltage reaches the level of 100 to 150 volts, the operation is switched to constant-voltage for a period of between 30 and 60 minutes. By this treatment, non-porous alumina 405 is formed on both sides of the aluminum channel 201 and causes the thickness of the non-porous alumina film 403 initially formed on the surface of the channel 201 to increas slightly to approximately 0.1 to 0.3 micron. In addition, this treatment result in the aluminum partially left in the course of forming porous alumina to be almost completely changed to alumina.

As has been described above, the aluminum film deposited on the substrate by evaporation or sputtering can be easily selectively anodized to form the insulating alumina film. The surface of the alumina film thus obtained is completely flat and facilitates subsequent processing steps.

The formation of the multi-level interconnection may be completed by providing openings in portions of the non-porous alumina so that the channels can be electrically connected to channels in the overlying layer, after which the above-described anodizing process may be carried out. In order to form openings in the non-porous alumina, an etching solution prepared by diluting a mixture of 35 g. chromic acid anhydride and 20 cc. phosphoric acid with one liter of water is applied to the desired locations at 70° to 75° C.

Since non-porous alumina is unaffected by the processing agent for porous alumina, aluminum film is unfailingly changed to the porous alumina thourgh this process. In addition, the forming process can be easily controlled through the regulation of the forming voltage or forming current.

Referring to FIGS. 5(A) through (E'), another preferred method of fabricating the semiconductor device in accordance with the present invention is illustrated. This method comprises steps similar to those of FIG. 4(A) thin film of aluminum 401 is first deposited on the surface of semiconductor substrate 101 (FIG. 5(A)). A photo resist substance 501 is then applied to partially cover the aluminum film 401 where the aluminum channels are to be formed (FIG. 5(B)). The portion of aluminum film 401 where the photo resist substance is not present is then anodized to form porous alumina 404 (FIG. 5(C)). The photo resist 501 is then removed. Next, a uniform non-porous alumina 502 is formed covering an aluminum channel 201 therein (FIG. 5(D)). Thereafter, the non-porous alumina is selectively removed from above the desired portion 503 of channel 201. The portion 503 is an opening either for a connection with a metallic channel in the overlying layer or for an external lead-out electrode (FIG. 5(E)).

Figure 5:
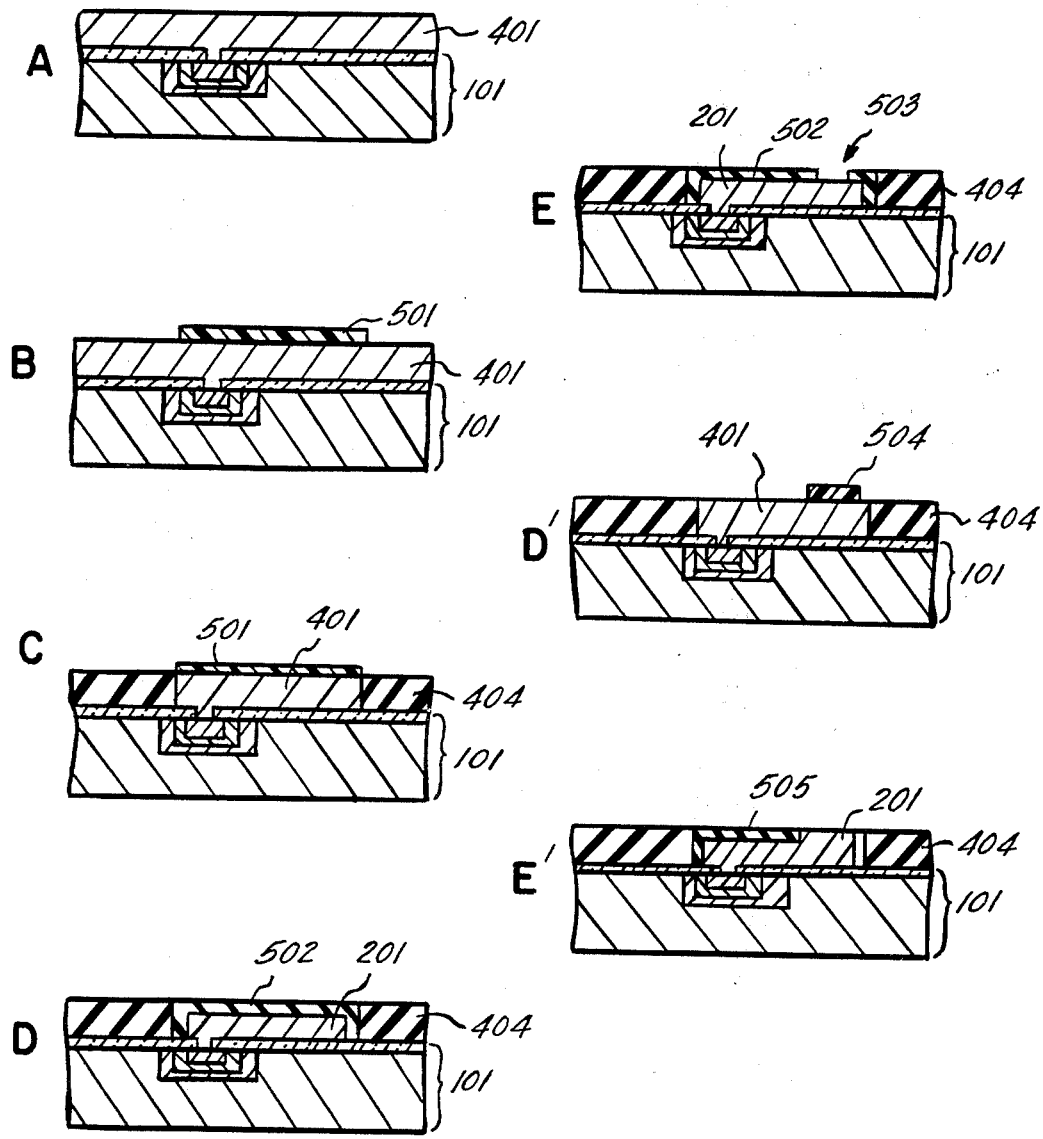

When it is desired to expose a part of the channel 201 on the same plane as the surface of the alumina film for facilitating the lead-out to external electrodes, the process of forming porous alumina 404 as indicated in FIG. 5(C) is performed and then followed by the provision of a mask 504 of photo resist subtance adherent to the electrode lead-out portion on the surface of the aluminum film 401 (FIG. 5(D')). Then, the non-porous alumina film 505 is formed. In this process, the mask 504 may be acid proof metal or alloy as well as photo resist substance.

In the embodiment just described, the porous alumina 404 and non-porous alumina 502 are formed under the same conditions as in the formation of the porous alumina 404 and non-porous alumina 405 as has been already explained in connection with the first manufacturing method.

As will be seen from the foregoing, the wiring layer comprising the metallic channels and insulating film formed through the above-described process can be flattened irrespective of how many such wiring layers are laminated to form the multi-level interconnection structure. Although some change in volume is possible in converting aluminum into alumina, any, unevenness attributable to this change in volume is negligible compared with that involved in the prior art device shown in FIG. 1. It may be noted that if the change in volume causes some unevenness over the surface of the anodic oxidation film, it does not adversely affect the flattened formation of the overlying wiring layer, because the boundary gradient between the wiring and the alumina is extremely gradual. Moreover, the semiconductor device of this invention withstands scratching and deposition of foreign matters on the wiring layer, because the wiring elements are protected by solid alumina.

In conventional semiconductor devices having aluminum channels, the formation of the channel may lead to the recrystallization of aluminum to form tiny protrusions on the surface of the aluminum wiring channels or cracks in the insulator film deposited on the channels. According to the instant invention, the aluminum channels are almost entirely buried in the alumina layer so that the channels show no tendency to deteriorate. Cracks do not form in the alumina film.

Figure 6:
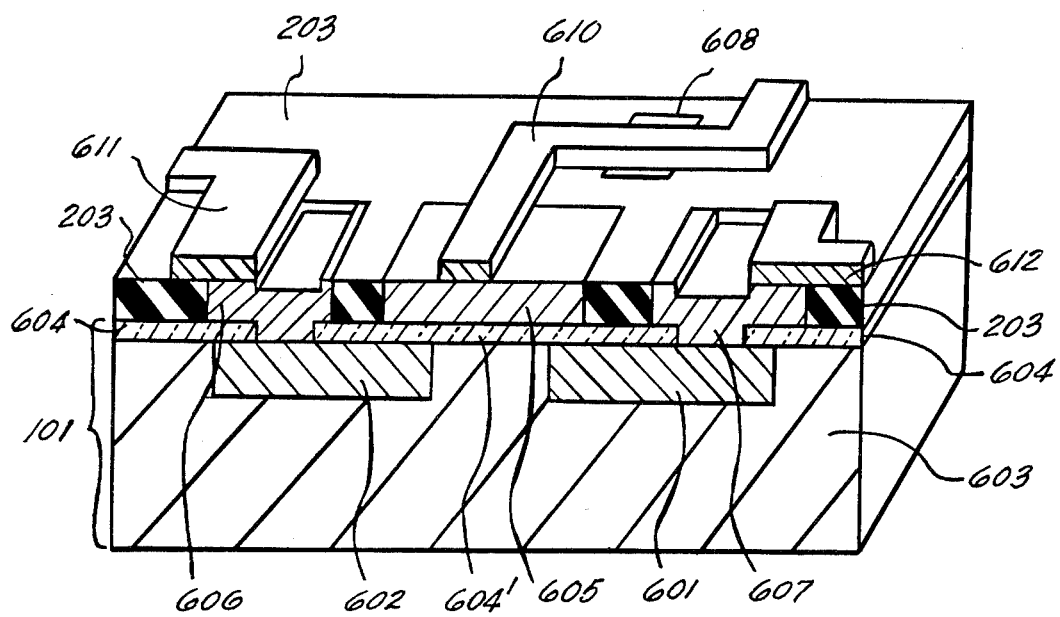
FIG. 6 shows a perspective view of still another embodiment of this invention.

Referring to FIG. 6 a field effect transistor 60, which is still another embodiment of the present invention, has a semiconductor substrate 101 so fabricated that drain and source regions 601 and 602 of n-type conductivity are formed in a p-type silicon substrate 603 in the same way as in conventional prior art devices. An insulating film adherent to the surface, which had been used as a mask for selective impurity diffusion, is then completely removed to expose the whole surface of the semiconductor substrate 603. Next, a thin film of silicon dioxide 604, about 0.25 micron thick, is uniformly deposited on the substrate surface. The film 604 covers the entire surface of the 603 with the exception of the electrode openings for the drain and source regions, 601 and 602. The film portion 604' of the deposited film 604 between the drain and source of the field effect transistor serves as a gate film insulator. Thereafter on the top surface of the semiconductor substrate 101, an aluminum film of uniform thickness of, about one micron, is deposited by vacuum evaporation. On each of the top portions where the gate, drain and source electrodes 605, 606 and 607 are to be formed, a photo resist film is applied. The aluminum film and the semiconductor substrate 101 are then anodized in dilute sulfuric acid with a concentration of 2%, at a temperature of 20° C. The voltage for this purpose is a constant 20 volts. On completion of this anodizing step, the aluminum layer which had been covered by the photo resist substance is converted into a first wiring layer composed of the gate electrode 605; drain electrode 606; source electrode 607; an electrode 608 of another circuit element; and an alumina insulator film 203 which surrounds those electrodes. In this embodiment, channels 610, 611 and 612 for the second channel layer are subsequently formed in the usual manner to provide interconnection for the respective circuit elements.

As will be seen from the description of the drawings, etching is not used in forming the electrodes 605, 606, 607, and 608. Note that lowermost laayer 604 of the insulating films is thin compared with those on the substrate. The thickness of the layer 604 may be about one third of the aluminum film 605. The electrodes thus obtained are, therefore, highly reliable.

Also, the overlying channel layers 610, 611, and 612 can be readily formed, because the surface of the first wiring layer is flat, smooth, and substantially parallel to the surface of the substrate 101. Thus interconnection reliability is enhanced.

This embodiment permits the use of different materials for the two groups of electrodes, i.e., the underlying layer electrodes 605, 606, 607 and 608 and the overlying layer electrodes 610, 611 and 612, with a view to facilitating the formation of the overlying interconnection. In addition, the overlying layer channels can be formed by anodic oxidation like those of the underlying layer. By so doing, the reliability of the overlying layer against mechanical shock such as scratching of the upper layer channels is improved.

While the foregoing description has been made in conjunction with semiconductor devices having at least one wiring layer comprising aluminum channels and alumina formed through the selective anodic oxidation of aluminum sheet, it is to be understood that the objects of the present invention can be also attained by substituting for aluminum with titanium, tantalum, niobium or other anodizable metal or material having the needed electrical characteristic, i.e., that it can be changed from conductive to insulative or vice versa by oxidation, nitriding, reduction or other chemical reaction.

The principal advantage of the present invention is summarized as follows. Since wiring layers are formed through the anodization and not through photo-etching, each of the wiring layers are relatively flat irrespective of how many layers are laminated on the substrate. This is in sharp contrast to the conventional device wherein uneveness is unavoidable in the multi-layered interconnection structure. Not that semiconductor devices to which the wiring layers as above described are applicable are not restricted to plane semiconductor substrate coated with silicon dioxide, it for example may be a mesa type device coated with insulator film. Also note that the silicon dioxide film adherent to the semiconductor base substrate may be coated with other insulator films, such as silicon nitride phosphosilicate glass, alumina-silicate glass, alumina formed by evaporation, sputtering or vapor growth process. Moreover, it is possible to further imrove the stability of the characteristics of the semiconductor device through thermal treatment in water vapor heated up to about 400° C. Also, it is possible to facilitate process control and quality checking of the completed device by way of differentiating wiring layers with colorants of insulative material, e.g., manganese oxide, cobalt oxide, copper oxide, iron oxide, and chromium oxide.

It will be apparent to those skilled in the art that further modifications of the embodiment are possible without departing from the scope and spirit of the invention. It is, therefore, to be understood that the foregoing description is made by way of example and not as a limitation to the scope of the invention as defined in the appended claims.

What is claimed is:

1. A method of manufacturing a semiconductor device including a lead-out wiring structure comprising the steps of;

preparing a semiconductor substrate including at least one circuit component therein and covered with an insulative film at the surface thereof, said insulative film having at least one opening formed therein, depositing a conductive metal film on said semiconductor substrate, said conductive metal film being electrically connected to said semiconductor substrate through said opening in said insulative film, and selectively anode-oxidizing said conductive metal film by applying an electrical voltage between said semiconductor substrate with said conductive metal film and an anode forming solution to form conductive channels in said conductive metal film, said conductive channels being isolated from one another by the resulting oxide of the metal of said conductive metal film.

2. The method of claim 1, wherein said conductive metal film deposited on said semiconductor substrate is comprised of a metal selected from the group consisting of aluminum, titanium, tantalum, niobium and hafnium.

3. The method of claim 1, wherein said conductive metal film is comprised of aluminum or tantalum.

4. The method of claim 1, wherein said selective anode-oxidizing step includes the steps of;

making selected portions of said conductive metal film at the locations of said intended conductive channels, at least one of said intended conductive channels being electrically connected to said semiconductor substrate through said opening in said insulative film, and converting the entire thickness of the unmasked area to anodized oxide.

5. The method of claim 4, wherein said conductive metal film is comprised of aluminum or tantalum.

6. The method of claim 1, wheren said selective anode-oxidizing step includes the steps of
masking a selected portion of said conductive metal film at a location of an intended insulating area,
converting a partial thickness of the unmasked area of said conductive metal film to anodized non-porous oxide,
unmasking the portion of said conductive metal film previously covered, and
converting the entire thickness of the previously masked portion of said conductive metal film to anodized porous oxide.

7. The method of claim 6, further including the step of converting small peripheral portions of said conductive channels into anodized non-porous oxide.

8. The method of claim 6, wherein said conductive metal film is comprised of aluminum.

9. The method of claim 1, wherein said selective anode-oxidizing step includes the steps of;
masking portions of said conductive metal film at the locations of the intended conductive channels,
converting the entire thickness of the unmasked area of said conductive metal film to anodized porous oxide,
unmasking the portions of said conductive metal film previously covered, and
converting a partial thickness of at least a part of the surface of the previously masked portions of said conductive metal film to anodized non-porous oxide.

10. The method of claim 9, wherein said conductive metal film is comprised of aluminum.

11. The method of claim 10, wherein small peripheral portions of said conductive channels are converted to anodized non-porous oxide.

12. The method of claim 11, wherein the whole surface of said previously masked portions of said conductive metal film is converted to anodized non-porous oxide film to a partial thickness, and an opening is provided in each anodized non-porous oxide film covering each of said previouly masked portions.

13. In the fabrication of an integrated semiconductor microcircuit wherein PN-junctions are passivated by an insulation layer, and wherein access windows are provided in the insulation layer for permitting ohmic contacts to be made to selected semiconductor regions, the improvement comprising:
depositing a conductor film on said windowed insulation layer; and
electrolytically converting selected portions of said conductor film to a nonconductor.

14. A method as defined by claim 13, wherein said converting step includes the step of masking a selected are of the conductor film and selectively converting the entire thickness of the unmasked portion to a nonconductor electrolytic anodization.

15. A method as defined by claim 14, wherein the converting step comprises immersing the masked structure in an electrolytic bath, connecting the conductor as the anode of an eectrolytic cell, and passing a suitable current through the cell, whereby the exposed areas are selectively oxidezed.

16. A method for the selective metallizaiton of a substrate comprising:
forming an insulation film on said substrate;
forming openings in said insulation film at location where electrical contact is desired to subjacent material;
depositing a metal film on said insulation film; selectively masking said metal film to provide a mask pattern corresponding to the desired metallization pattern; and
electrolytically converting the unmasked areas of said metal film to a nonconductor to form an inlaid metallization pattern.

* * * * *